United States Patent
Von Hartel

[11] 3,976,555
[45] Aug. 24, 1976

[54] METHOD AND APPARATUS FOR SUPPLYING BACKGROUND GAS IN A SPUTTERING CHAMBER

[75] Inventor: Herbert Von Hartel, Lexington, Mass.

[73] Assignee: Coulter Information Systems, Inc., Bedford, Mass.

[22] Filed: Mar. 20, 1975

[21] Appl. No.: 560,352

[52] U.S. Cl. ................................. 204/192; 204/298
[51] Int. Cl.² ............................................ C23C 15/00
[58] Field of Search ............................. 204/192, 298

[56] References Cited
UNITED STATES PATENTS

| | | | |
|---|---|---|---|
| 3,418,229 | 12/1968 | Lakshmanan et al. | 204/192 |
| 3,738,928 | 6/1973 | Glaser | 204/298 |
| 3,748,253 | 7/1973 | Provenzano et al. | 204/298 |
| 3,827,966 | 8/1974 | Needham | 204/298 |
| 3,855,612 | 12/1974 | Rosvold | 204/192 X |
| 3,856,654 | 12/1974 | George | 204/298 |
| 3,890,217 | 6/1975 | Burrows et al. | 204/298 |

OTHER PUBLICATIONS

C. H. George, "Cylindrical Diode Continuous Vacuum Sputtering Equipment for Laboratory & High Volume Production," J. Vac. Sci. Tech., vol. 10, No. 2, Mar./Apr. 1973, pp. 393–397.

*Primary Examiner*—John H. Mack
*Assistant Examiner*—Aaron Weisstuch
*Attorney, Agent, or Firm*—Silverman & Cass, Ltd.

[57] ABSTRACT

In a sputtering chamber where there is at least one target of some material comprising at least two elements which are to be sputtered as a compound onto a substrate within the chamber, a target having a plurality of edges is framed by a metallic shield to confine the sputtering to a forward direction and the background gas needed for maintaining stoichiometry of the sputtered material is injected directly inside of the shield so that immediately upon entry into the chamber a substantial portion thereof flows over the target. A perforated manifold running the length of an edge of the target releases the background gas to the target along its length.

17 Claims, 4 Drawing Figures

METHOD AND APPARATUS FOR SUPPLYING BACKGROUND GAS IN A SPUTTERING CHAMBER

CROSS-REFERENCE TO RELATED APPLICATIONS

Applicant hereby incorporates by reference herein the disclosures of:
1. U.S. patent application Ser. No. 322,968 filed Jan. 12, 1973 entitled Thin Film Deposition Using Segmented Target Means, now U.S. Pat. No. 3,829,373 granted Aug. 13, 1974; and
2. U.S. patent application Ser. No. 323,133 filed Jan. 12, 1973 entitled Sputtering Method for Thin Film Deposition on a Substrate, now U.S. Pat. No. 3,884,787 granted May 20, 1975, both owned by the assignee hereof.

FIELD AND BACKGROUND OF THE INVENTION

This invention is concerned with r.f. sputtering of compounds in sputtering chambers.

For background of the field of the invention, reference may be had to U.S. Pat. No. 3,829,373 and to the disclosure of application Ser. No. 323,133 filed Jan. 12, 1973, now U.S. Pat. No. 3,884,787, whose disclosures are incorporated herein by reference. As a consequence, the details of the sputtering apparatus which are not directly concerned with this invention will not be included herein.

Briefly, the type of sputtering involved is a technique where the target is a member formed of the material which is to be sputtered onto a substrate, but is composed of more than a single element. In the practical example of this invention, it was desired to sputter cadmium sulfide onto a substrate of flexible, thin polyester resin material. As explained in the above-mentioned patent and application, the atmosphere in the sputtering chamber is argon, which provides the gas to be ionized and provides the plasma that furnishes the atoms that knock the molecules of cadmium sulfide out of the target and drive them to the substrate. Theoretically, if the stoichiometry of the target is perfect, then there is no need for any additional materials to be added to the atmosphere in the chamber. Actually, the vapor pressure of sulfur is less than that of cadmium, hence there is a tendency for the material of the target to be dissociated under bombardment and the sulfur to be driven off first. This causes sulfur to escape and be drawn off by the vacuum pump that is keeping the pressure in the chamber down.

Accordingly, it is known to provide a background gas to prevent the decomposition of the target material. This will be a gas that has a component which is the same as the most volatile of the elements making up the target. In the case of cadmium sulfide, this element is sulfur and the gas which is best used is hydrogen sulfide.

Very little work has been done in the sputtering field with targets and substrates that are larger than about six inches in diameter. As a matter of fact so far as known there has been nothing reported in the literature on the r.f. sputtering of multiple element compounds onto substrates which have the size which the applicant's substrate has. The applicant's substrate is a strip of polyester material, such as "Mylar" (Dupont trademark) which has a width of about 500 mm. and a length which is limited only by the size of roll that can be accommodated without interference inside of the chamber. Applicant uses a pair of targets which are each 240 mm × 560 mm in exposed surface. This should be contrasted with the usual target of about 30 square inches. Thus, the target of the applicant is of the order of 10 times larger than commonly used targets.

The conditions which exist in a sputtering chamber are not duplicated when the target and sputtered area are substantially increased in size. Thus, one cannot merely make everything bigger and expect to get a larger yield. Problems arise because of the large areas involved. The most important of these have to do with uniformity of deposit and stoichiometry, although many additional problems require solution of a nature not within the purview of this invention.

The need for background gas is common to sputtering machines with small targets as well as large targets. In the case of small sputtering apparatus, one merely admits the gas into the chamber and adjusts the pressure for best results. In the case of the larger apparatus, it was found that merely admitting the gas and attempting to adjust the pressure was not enough. Targets were pitting and cracking, deposits were not uniform, stoichiometry was not maintained. For example, if stoichiometry is perfect, the properties of the coating will not improve substantially with heat treatment.

The invention achieved excellent results by a structural change which enables the background gas to be admitted in a most unusual place. The gas is applied with the plasma-forming gas to the target directly over its surfaces as it is sputtering and only thereafter flows into the chamber. In this manner the disadvantages mentioned above have been eliminated.

SUMMARY OF THE INVENTION

In a sputtering apparatus wherein a compound made of plurality elements is to be sputtered and there is a need for background gas, the target has a grounded shield which closes off all of the target except for the exposed surface from which the molecules are going to be knocked. The shield thus forms a confined box which opens to the sputtering chamber in a rectangular opening framing the sputtering surface of the target. The background gas is led to the sputtering chamber along with the plasma-forming gas by means of a conduit which is connected directly to the shield and passes through a wall thereof and into the box. The gas mixture emerges through the rectangular opening and preferably along one edge of the target. For this purpose a perforated manifold is disposed alongside that edge and connected as a continuation of the gas conduit coming from outside of the chamber.

DESCRIPTION OF THE PREFERRED EMBODIMENT

As mentioned above, for the details of the sputtering process and apparatus reference may be had to the patents identified. The invention herein is principally concerned with that portion of the apparatus which relates to the introduction of the background gas.

Figure 1:
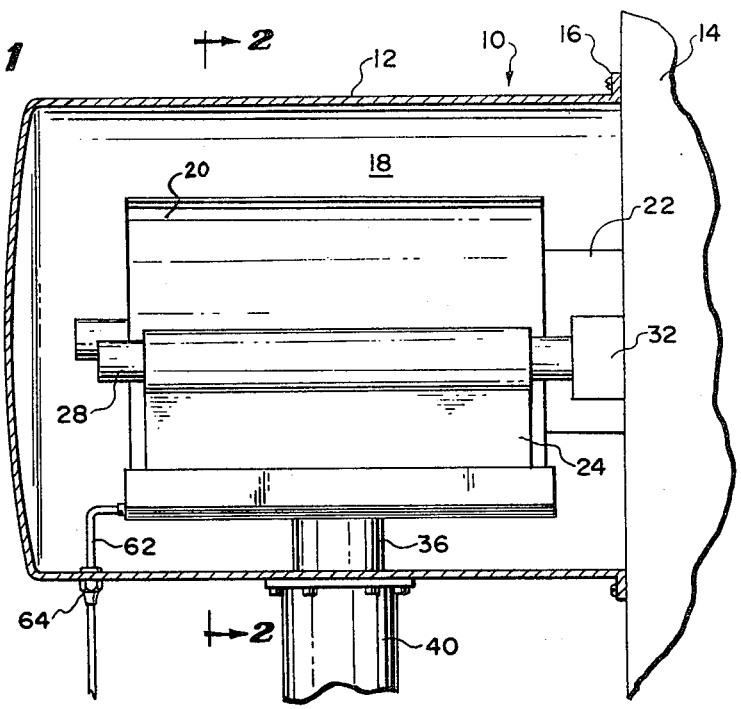
FIG. 1 is a highly simplified diagrammatic view taken generally through sputtering apparatus constructed in accordance with the invention, parts being shown in section and parts in elevation.
Figure 2:
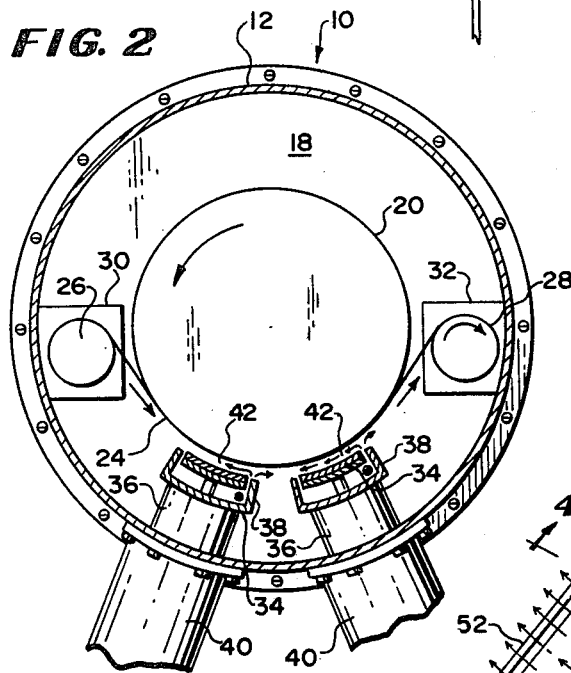
FIG. 2 is another diagrammatic view through the sputtering apparatus, this being a sectional view taken along the line 2—2 of FIG. 1 and in the indicated direction.

In FIGS. 1 and 2 there is illustrated a sputtering apparatus 10 which, according to the invention, can be operated with greater efficiency and improved results through the use of the invention. The apparatus 10 is shown as a vessel 12 of stainless steel or the like mounted on a suitable framework 14 by suitable fastening means, gaskets, and the like as at 16. The framework may include electrical, mechanical and the like mechanisms used for operating the system in any suitable manner.

The vessel 12 defines a chamber 18 in which there is disposed a suitably journalled drum 20 that is mounted at 22 on suitable supports carried by the framework 14. This drum is of stainless steel also, and may be cooled or heated by suitable liquids in any suitable manner. The drum serves as the anode of the sputtering system, which in this case is an r.f. type that is non-reactive. In other words, there is no reaction intended to take place in the chamber 18, although reactive sputtering may well be improved also by the use of the invention.

The substrate of the apparatus upon which the material sputtered is to be coated in this case comprises an elongate strip 24 of polyester resinous material, flexible and transparent, that is carried on a supply roll 26, led around the bottom circumferential part of the drum 20 and taken up by the take-up roll 28. These rolls are mounted and driven through suitable means indicated symbolically at 30 and 32 respectively. The drive means are not shown but could be within the framework 14.

The sputtering is effected because of the existence of targets 34 at the bottom of the chamber 18, these targets comprising cathodes and being electrically driven through suitable connections by an r.f. power supply outside of the chamber 18. The large conduits 36 are intended to indicate the electrical and mechanical connections for the targets. The targets 34 are electrically insulated from the vessel 12 and the shields 38, the latter being grounded also. The conduits 36 connect with extensions 40 outside of the vessel 12 and there is a pressure tight seal at each point where the conduits engage the vessel.

The operation of the sputtering apparatus 10 is explained in the referred to patents. For the purpose of this specification, it is sufficient to state that an atmosphere of argon is admitted to the chamber after it is pumped down. The argon is ionized by an r.f. field that is established between the targets 34 and the drum 20 giving rise to a plasma across the gap 42. The argon ions knock molecules of the material from which the targets are made out of the targets, these molecules flying across the gap 42 and impinging on the substrate 24 which is covering the drum 20 at those points. The substrate is moved slowly through the gap and the material of the targets coats the same.

In the case of the targets where the material is a compound made of several elements, background gas at relatively low pressure is admitted to prevent the decomposition of the target material so that a uniform and stoichiometric deposit is made and so that the targets themselves will not be destroyed.

In the practical device, there were two targets 34 each presenting a surface of about 240 × 560 mm and separated by about 150 to 200 mm circumferentially. The axial width of the drum 20 was 540 mm and the substrate 24 was about 5 mils thick and has a width of 500 mm. The gap 42 was 4–5 centimeters and the diameter of the drum was about 500 mm. The total internal gas pressure during sputtering was from 10 to 20 millitorr. Most work was done with a pressure of 10 millitorr. The target material was ultrapure cadmium sulfide (CdS) in a form that was compressed and baked into several rectangular pieces that were cemented as a mosaic onto copper backings, nickel-plated to resist corrosion. Stainless steel backings have been used but are not as easy to keep cool.

None of the water cooling means for the targets and shields are shown and likewise the hot oil warming conduits for the drum are not shown in the drawings.

The background gas comprising pure hydrogen sulfide ($H_2S$) is admitted to the chamber intermixed with argon gas in the proportion of about 15.7 parts of argon to 1 part of hydrogen sulfide. The hydrogen sulfide is thus about 6% of the mixture, which can be pre-mixed and furnished in single pressurized tanks by commercial suppliers. The purpose of the $H_2S$ is to prevent decomposition of the cadmium sulfide so that it is deposited in stoichiometrically correct molecule form. The pressure of gas in the chamber is maintained at about 9.5 to 10 millitorr although increased pressure up to 20 millitorr have been used on occasion.

Figure 3:
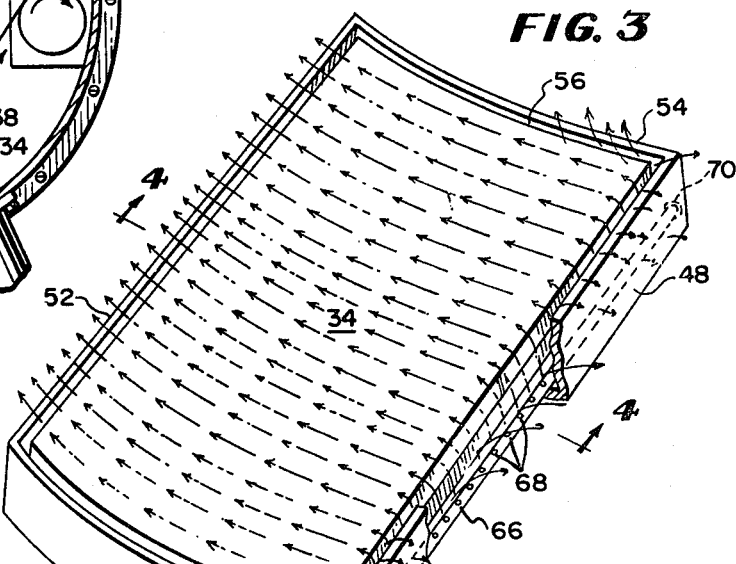
FIG. 3 is an enlarged perspective view of the target of the apparatus of FIGS. 1 and 2 with a portion broken away to show the interior thereof.
Figure 4:
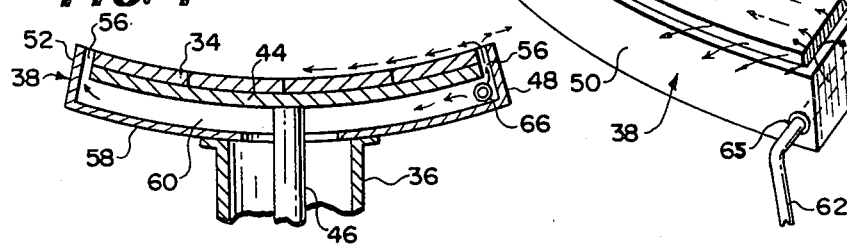
FIG. 4 is a sectional view taken generally along the line 4—4 of FIG. 3 and in the indicated direction.

Referring now to FIGS. 3 and 4 which show one of the targets 34 and its shield 38, the target 34 is made up of mosaics of cadmium sulfide which are cemented onto the nickel-plated copper backing plate 44 mounted to the support member 46 passing through the conduit 36. The target 34 and its mounting plate 44 are insulated from the remainder of the apparatus and the support member includes electrical connections for driving the target with r.f. The shield 38 is a box-like structure of copper or other good heat conducting material, suitably plated to prevent corrosion or contamination. It is carried by the conduit 36 and is grounded. The side walls 48, 50, 52 and 54 have their edges flush with and spaced from the outer edges of the target 34 to provide a framing gap 56 all around the target. The purpose of the shield 38 is to prevent the sputtering of the material from the target onto the sides and back of the target. The dimension of the gap 56 is chosen so that this will not happen.

The back of the target is closed off as shown at 58 to prevent back sputtering of the rear of the target plate 44.

It is seen that this construction provides a closed box-like structure which has an interior space 60. According to the invention, the background gas which is $H_2S$ in this case and the intermixed argon gas are both admitted to the space 60 and find their way out through the gap 56. This means that the gases are immediately engaged against the target surface at the earliest possible moment so that the influence of the hydrogen sulfide in preventing decomposition of the target and the molecules emerging therefrom is most effective.

The preferred way of admitting the gases to the space 60 is to bring the gas conduit 62 from the outside of the vessel 12 through a gas tight fitting 64 to a fitting 65 provided on an end wall 50 and thence through said end wall 50. On the interior of the space 60 there is provided an elongate pipe 66 which is perforated along its top side as shown at 68 and has a plug 70 at its free end. Thus, the pipe 66 acts as a manifold, and gas which is admitted will enter the space 60 and pass preferably through the gap alongside of the wall 48, passing over the surface of the target 34.

It will be appreciated that when this is occurring the drum 20 and substrate 24 are just a short distance from the target surface so that the gas follows the arrows shown in FIGS. 3 and 4 over the target surface being fairly confined to this travel. It is true that some of the gas will pass away from the target but the gas passing over the target has been found so effective as very substantially to provide the preservation of the targets and the uniformity of deposit that is sought. Without the construction of the invention it was very difficult to keep the targets from decomposing and also the results represented by the coatings were not predictably uniform.

As seen in FIG. 2, if the right hand target has its manifold 66 on its right side and the left hand target has its manifold on the right side, the tendency of the gas from the left hand manifold to move away from its target is not too undesirable since it will pass toward the right hand target.

The invention is applicable primarily to nonreactive sputtering, but in any apparatus where it is essential that a gas admitted be effective as close to the target as possible, the invention is of value. It is also of interest to note that the location of the manifold 66 within the shield enables the gas to be released close to the target without having the target material sputtered onto the manifold. Thus, it and its perforations remain clean.

Variation is feasible without departing from the spirit or scope of the invention as defined in the appended claims.

What is claimed and desired to secure by Letters Patent of the United States is:

1. A method of sputtering in which there is a target having a plurality of edges that is surrounded by a shield that is spaced from the target and defines a gap around the edges of the target and in which gas is to be admitted to the atmosphere surrounding the target, the step of admitting the gas from the rear of the target within the shield so that it flows through the gap from behind the target substantially along only one edge of said target and impinges on the face of the target immediately after it leaves the gap during sputtering.

2. The method as claimed in claim 1 in which the gas is released through the gap simultaneously along the entire length of the target on said one edge of said target.

3. The method as claimed in claim 2 in which the gas is released at a plurality of spaced points along said length.

4. The method as claimed in claim 1 in which there are plural like targets and the gas is flowed over each respective target from the same side thereof.

5. The method as claimed in claim 1 in which the gas is flowed in a direction transverse the target from one side thereof.

6. Sputtering apparatus which includes a vessel having a target having a plurality of edges and an anode and means for admitting gas to the vessel by way of a conduit from the exterior of the vessel, comprising:

A. a shield surrounding the target on its sides and rear and leaving only a face exposed, the edges of the shield being spaced from the edges, of the exposed face and thereby forming a communication gap, the shield forming a partially enclosed space behind the target such that the gap communicates between the space and the chamber formed in the vessel, B. the anode being parallel with and spaced from the target face and providing a sputtering gap, C. a conduit passing through the vessel wall and adapted to be connected to a source of said gas exterior of the vessel, the conduit being connected to said shield and opening only to the space on the inside of the shield, and D. means cooperating with said opening for flowing said gas substantially along only one edge of said target.

7. The apparatus as claimed in claim 6 in which the conduit includes an elongate perforated manifold arranged within said space and extending along the length of the target, the perforations thereof opening to the communication gap.

8. The apparatus as claimed in claim 6 in which the target and the shield have parallel conforming facing surfaces defining said space, said conduit terminating in an elongate manifold having at least one row of perforations formed along the length thereof and opening toward the communication gap.

9. The apparatus as claimed in claim 6 in which there are at least two targets, each target having a shield surrounding same defining a communication gap perimetrically surrounding each sputtering surface thereof, each shield having a conduit for leading gas therein and including a continuation formed as a perforated manifold disposed lengthwise along one side of the target, each manifold adapted to pass gas from the conduit over the sputtering surface of its associated target.

10. The apparatus as claimed in claim 9 in which the manifolds are disposed on the same side of their associated targets.

11. The apparatus as claimed in claim 9 in which the perforations of said manifolds are arranged opening toward the communication gap.

12. The apparatus as claimed in claim 6 in which the target comprises a base member and a mosaic formed on the base member consisting of individual compacted sections of target material.

13. For use in a sputtering apparatus wherein a target formed of a material to be sputtered is introduced into a pressure vessel as a cathode, the target having a sputtering surface of said material, there is an anode parallel with and spaced from the target to define a sputtering gap and there are means for introducing a gas into the vessel by way of a conduit from the exterior of the vessel; means for leading said gas across the sputtering gap during sputtering comprising: a grounded shield of size and configuration capable of defining an enclosure about all but the sputtering surface of the target and a communication gap defined along at least one edge of the target between the target and said shield, a gas conduit leading interior of the said enclosure and having a continuation arranged within the enclosure along at least one edge of the target, the continuation of the conduit having a plurality of spaced perforations along its length contiguous with said communication gap and said conduit adapted to be coupled to a source of gas for leading gas to said continuation to flow same through said perforations along the length thereof to the communication gap and across the sputtering surface through the sputtering gap.

14. The apparatus as claimed in claim 13 in which the continuation is disposed below the target and the perforations open toward the communication gap.

15. The apparatus as claimed in claim 14 in which the continuation is offset from the target edge.

16. The apparatus as claimed in claim 13 in which there are plural like targets, each having a partially enclosing shield structure and a gas conduit leading thereinto and including said perforated continuation, each said continuation located on the same side of its respective target.

17. In a sputtering apparatus having a sputtering chamber, at least one target having a plurality of edges formed of a material which includes at least two elements which are to be sputtered as a compound onto a substrate within the chamber; a metallic shield framing the target and enclosing all but the sputtering surface thereof confining the sputtering to a forward direction and means for introducing into the chamber a background gas required for maintaining stoichiometry of the sputtered material; said metallic shield defining a gap communicating to said sputtering surface along at least one edge of said target, and said introducing means comprising a conduit leading from the exterior of said vessel to the interior of said enclosure, said conduit including a portion interior of said enclosure defining a perforate manifold disposed below the target and along said one edge thereof, the perforations opening to said communication gap whereby the background gas is released along the length of said manifold and flowed through the communication gap over the sputtering surface of said target into the chamber.

* * * * *